United States Patent
Oh et al.

(10) Patent No.: US 8,063,313 B2
(45) Date of Patent: Nov. 22, 2011

(54) PRINTED CIRCUIT BOARD AND SEMICONDUCTOR PACKAGE INCLUDING THE SAME

(75) Inventors: Yun-Jin Oh, Daejeon (KR); Chang-Hoon Han, Chungcheongnam-do (KR); Kwang-Ryul Lee, Gyeonggi-do (KR); Hyoung-Suk Kim, Chungcheongnam-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 612 days.

(21) Appl. No.: 12/263,614

(22) Filed: Nov. 3, 2008

(65) Prior Publication Data
US 2009/0179335 A1    Jul. 16, 2009

(30) Foreign Application Priority Data
Jan. 15, 2008   (KR) .................. 10-2008-0004427

(51) Int. Cl.
*H05K 1/16* (2006.01)
*H05K 3/30* (2006.01)

(52) U.S. Cl. ........... 174/260; 257/782; 361/783; 29/832

(58) Field of Classification Search .................. 174/260; 361/783; 257/782–783; 29/832–841
See application file for complete search history.

(56) References Cited

U.S. PATENT DOCUMENTS
2008/0136033 A1 * 6/2008 Nagamatsu et al. .......... 257/758

FOREIGN PATENT DOCUMENTS
| JP | 01-165495 | 6/1989 |
| JP | 09-055579 | 2/1997 |
| JP | 11-260954 | 9/1999 |
| KR | 1998-020727 | 6/1998 |

OTHER PUBLICATIONS

English language abstract of Korean Publication No. 1998-020727.
English language abstract of Japanese Publication No. 01-165495.
English language abstract of Japanese Publication No. 09-055579.
English language abstract of Japanese Publication No. 11-260954.

\* cited by examiner

*Primary Examiner* — Jeremy Norris
(74) *Attorney, Agent, or Firm* — Muir Patent Consulting, PLLC

(57) ABSTRACT

A printed circuit board (PCB) and a semiconductor package that are configured to prevent delamination and voids. In one example embodiment, the semiconductor package includes a PCB having a base substrate on which conductive patterns are formed and which includes an interior region having a die paddle for receiving a semiconductor chip and an exterior region disposed outside the interior region. The PCB also includes a first solder resist formed on a portion of the base substrate corresponding to the interior region and a second solder resist formed on a portion of the base substrate corresponding to the exterior region. The second solder resist may also have a greater surface roughness than the surface roughness of the first solder resist.

20 Claims, 9 Drawing Sheets

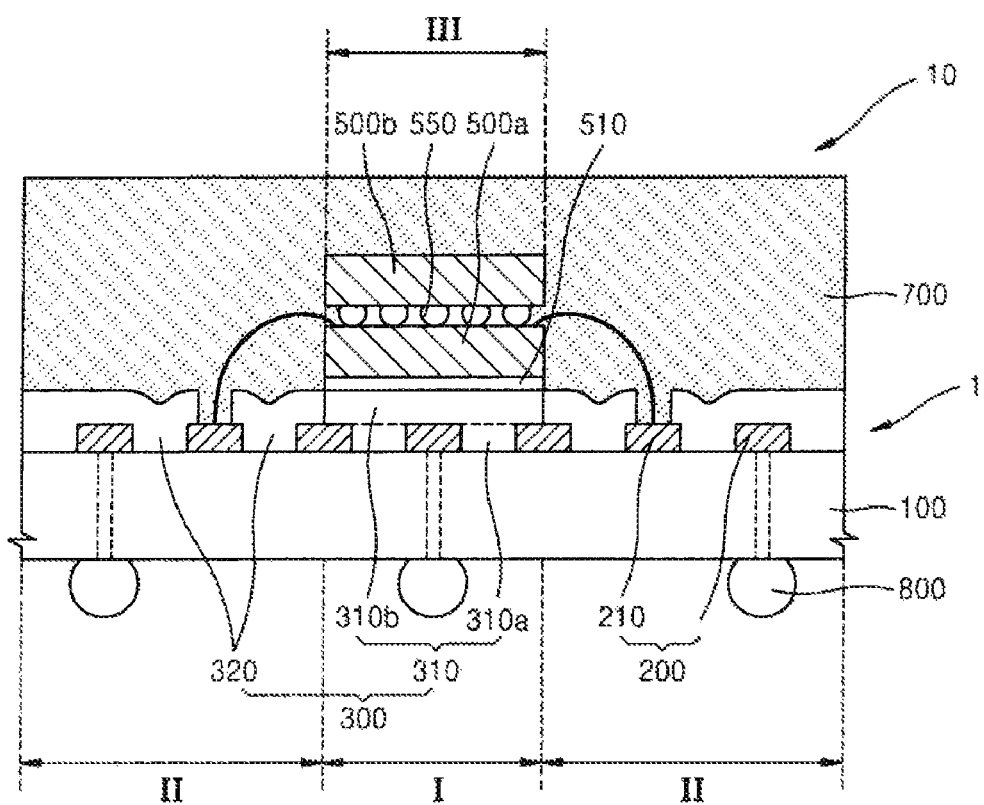

PRINTED CIRCUIT BOARD AND SEMICONDUCTOR PACKAGE INCLUDING THE SAME

CROSS-REFERENCE TO RELATED PATENT APPLICATION

This application claims the benefit of Korean Patent Application No. 10-2008-0004427, filed on Jan. 15, 2008, in the Korean Intellectual Property Office, the disclosure of which is incorporated herein by reference.

BACKGROUND

1. Field of the Invention

The present invention relates to a printed circuit board (PCB) used for manufacturing a semiconductor package and a semiconductor package including the PCB, and more particularly, to a PCB to which a semiconductor chip is attached using an adhesive tape and a semiconductor package including the PCB.

2. Description of the Related Art

To meet the demands of consumers for smaller and lighter electronic devices, a need to further miniaturize and reduce the size and weight of semiconductor devices within these electronic devices is apparent. In addition, it is also desirable for these semiconductor devices to have similar or improved performance characteristics over previous generations of semiconductor devices. In order to improve performance while increasing integration density of the semiconductor device, the thickness of the semiconductor device generally needs to be increased.

Accordingly, semiconductor packages have been developed as multi-chip packages (MCP) employing a plurality of semiconductor chips in order to account for the need for increased integration density. A MCP generally includes a plurality of semiconductor chips attached to a semiconductor package substrate. As a result, however, when a plurality of semiconductor chips are stacked the thickness of a semiconductor package is increased.

The thickness of a semiconductor chip can be reduced by grinding out a portion of the semiconductor chip where a circuit connection line is not formed. However, when adhesives, such as epoxy, are used to attach a semiconductor chip to a semiconductor package substrate, an increase in the thickness of the semiconductor package may result, as well as the introduction of various other problems. Thus, film-type adhesives have been introduced. However, as the thickness of a semiconductor chip is reduced, fine voids are generated, thereby deteriorating the reliability of a semiconductor package. In addition, delamination may occur between a semiconductor package substrate and a sealant, thereby deteriorating the reliability of a semiconductor package and increasing the failure rate of semiconductor packages.

SUMMARY

Embodiments of the present invention provide a printed circuit board (PCB) that is configured to prevent voids and delamination of a sealant.

Additional embodiments of the present invention also provide a semiconductor package including the PCB described above.

According to an exemplary embodiment of the invention, a printed circuit board (PCB) includes a base substrate on which conductive patterns including a bond finger portion are formed and which includes an interior region having a die paddle for receiving a semiconductor chip and an exterior region disposed outside the interior region. The PCB also includes a first solder resist formed on a portion of the base substrate corresponding to the interior region and a second solder resist formed on a portion of the base substrate corresponding to the exterior region. The second solder resist may also have a greater surface roughness than the surface roughness of the first solder resist.

BRIEF DESCRIPTION OF THE DRAWINGS

The above and other features and advantages of the present invention will become more apparent by describing in detail exemplary embodiments thereof with reference to the attached drawings in which:

FIGS. 15 through 17 are cross-sectional views of a semiconductor package according to embodiments of the present invention.

DETAILED DESCRIPTION

Figure 1:
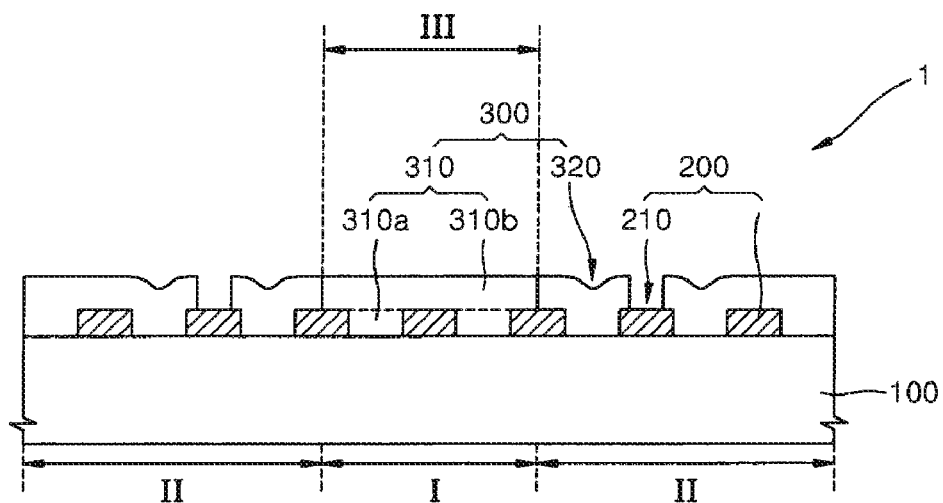
FIG. 1 is a cross-sectional view of a printed circuit board (PCB) according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. It will also be understood that when a layer is referred to as being "on" another layer or substrate, it can be directly on the other layer or substrate, or intervening layers may also be present. In the drawings, the thicknesses of layers and regions are exaggerated for clarity. The same reference numerals in the drawings denote the same element.

The terms are only for illustrative purposes and are not intended to limit the scope of the present invention.

FIG. 1 is a cross-sectional view of a printed circuit board (PCB) 1 according to an embodiment of the present invention.

Referring to FIG. 1, the PCB 1 includes a base substrate 100, conductive patterns 200 and a solder resist 300, which are sequentially formed. The base substrate 100 is formed of an insulating material that may be a rigid material such as a bismaleimide triazine (BT) resin, frame retardant 4 (FR4), or the like. Alternatively, the base substrate 100 may be formed of a flexible material such as polyimide (PI), polyester (PET), or the like.

The conductive patterns 200 may be formed of a metal material such as copper (Cu). Alternatively, conductive patterns 200 may be formed using a method including first forming a metal material pattern, such as Cu, and then plating a portion of the pattern with a different metal material (e.g., nickel (Ni) or gold (Au)). A portion of the conductive patterns 200 may be used for a bond finger portion 210 which is externally exposed. In particular, the bond finger portion 210 may be formed using a method including forming a pattern of a metal material, such as Cu, and then plating a portion of the pattern with a different metal material (e.g., Ni or Au). The conductive patterns 200 may be formed so that an upper surface of the conductive patterns is non-coplanar with an upper surface of the base substrate in the interior region. That is, the conductive patterns may have unevenness at the die paddle for receiving a semiconductor chip 500. The conductive patterns 200 are illustrated as line-and-space patterns, but the present invention is not limited thereto, and may include other patterns where the conductive patterns 200 are uneven.

The solder resist 300 includes a first solder resist 310 formed on an interior region I and a second solder resist 320 formed on an exterior region II. The interior region I may include the die paddle III to which a semiconductor chip is attached, and the interior region I may be formed to have a similarly sized area as that of the die paddle III. However, various kinds of semiconductor chips or processing margin may cause the interior region I to be wider than the die paddle III.

The first solder resist 310 may be formed to be a substantially flat plane having no surface roughness. The second solder resist 320 may have greater surface roughness than the surface roughness of the first solder resist 310. The second solder resist 320 may have surface roughness in a range of several to several tens of μm.

The first solder resist 310 may be formed of a film-type solder resist. The first solder resist 310 may be formed by attaching a film-type solder resist that is previously formed to fit the interior region I. Alternatively, the first solder resist 310 may be formed by attaching a film-type solder resist onto a front surface of the base substrate 100, and then removing portions of the film-type solder resist that are not attached to the interior region I. After the film-type solder resist is attached to the interior region I, the film-type solder resist may be heated or pressurized. When the first solder resist 310 is formed of a film-type solder resist, the first solder resist 310 may have surface roughness of several μm or less due to the surface roughness of the conductive patterns 200. Preferably, the surface roughness of the first solder resist 310 may be in a range of about 0.1 to about 3 μm.

The second solder resist 320 may be formed by spraying an ink-type solder resist onto the exterior region II. After the ink-type solder resist is applied, the ink-type solder resist may be heated or pressurized. When the second solder resist 320 is formed of an ink-type solder resist, the second solder resist 320 may have surface roughness in a range of several to several tens of μm due to the unevenness of the conductive patterns 200. Preferably, the surface roughness of the second solder resist 320 may be in a range of about 3 to about 10 μm. Unlike the case of a film-type solder resist, an ink-type solder resist may be greatly affected by unevenness of a layer disposed below the ink-type solder resist. Thus, the second solder resist 320 may have a greater surface roughness than the surface roughness of the first solder resist 310.

The first solder resist 310 may include a solder insulating layer 310a and a third solder resist 310b. The solder insulating layer 310a may have the same height as that of the conductive patterns 200. The third solder resist 310b may be formed on the conductive patterns 200 and the solder insulating layer 310a. The solder insulating layer 310a may be formed to fill spaces between the conductive patterns 200 disposed on the interior region I, and may be formed of, for example, an insulating material.

The second solder resist 320 and the third solder resist 310b may be substantially simultaneously formed. In this case, the second solder resist 320 and the third solder resist 310b may be formed of an ink-type solder resist. Thus, the first solder resist 310 may be formed to be a substantially flat plane, while the second solder resist 320 may have surface roughness in a range of several to several tens of μm. Preferably, the surface roughness of the second solder resist 320 may be in a range of about 3 to about 10 μm.

Although not illustrated in FIG. 1, a conductive pattern and a solder resist layer may also be formed on a bottom surface of the base substrate 100. When a semiconductor chip is attached to the bottom surface of the base substrate 100, the solder resist layer may be formed so as to be divided into a first solder resist and a second solder resist like in the case of the first solder resist 310 and the second solder resist 320 that are formed on the base substrate 100. On the other hand, when a semiconductor chip is not attached on the bottom surface of the base substrate 100, the solder resist layer formed on the bottom surface of the base substrate 100 may be formed as a single layer.

FIGS. 2 through 5 are cross-sectional views for illustrating a method of manufacturing a PCB 1 according to another embodiment of the present invention.

Figure 2:
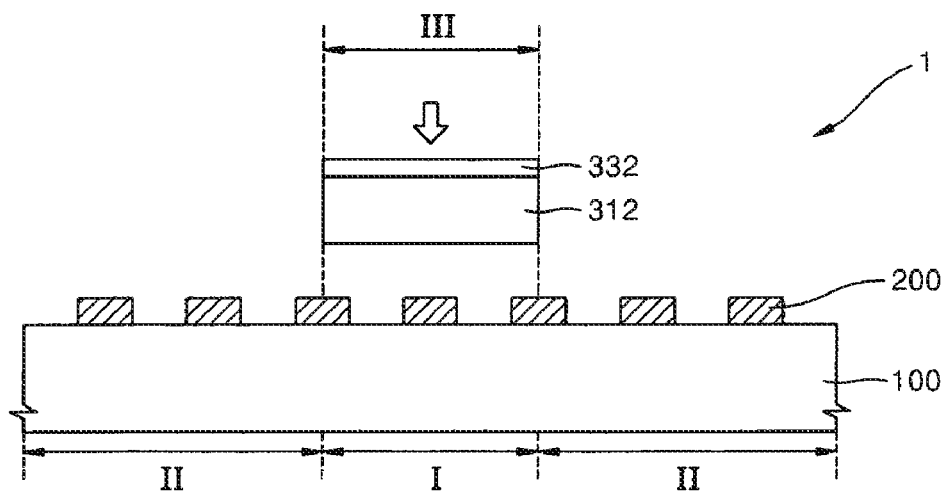
FIGS. 2 and 3 illustrate an operation of forming a first solder resist on a base substrate on which conductive patterns are formed, according to an embodiment of the present invention.
Figure 3:
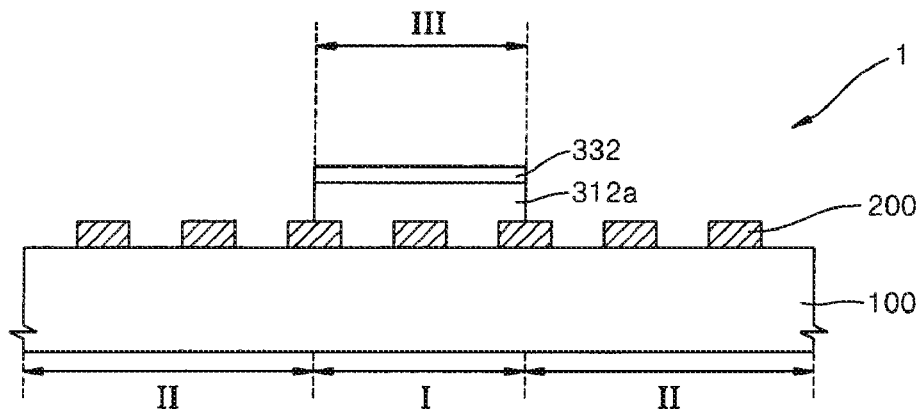

FIGS. 2 and 3 illustrate an operation of forming a first solder resist 312a on a base substrate 100 on which conductive patterns 200 are formed.

Referring to FIGS. 2 and 3, a first solder resist material 312 may be previously formed so that the area of the first solder resist material 312 corresponds to the area of the interior region I of the PCB 1. The first solder resist material 312 may be a film-type solder resist. The first solder resist material 312 may then be attached to the base substrate 100 on which the conductive patterns 200 are formed. The first solder resist material 312 may be formed to be a thin film type, and may be transformed to reduce the step difference of the conductive patterns 200 formed below the first solder resist material 312; surface roughness of the first solder resist 312a may reduce the influence of unevenness due to the conductive patterns 200. When a film-type solder resist is used as the first solder resist material 312, the first solder resist 312a may have a surface roughness of several μm or less due to the unevenness of the conductive patterns 200. Preferably, the surface roughness of the first solder resist 312a may be in a range of about 0.1 to about 3 μm. In addition, when the first solder resist 312a is formed to include a first solder resist material 312, the first solder resist 312a may be heated or pressurized during formation.

A first protective layer 332 may be attached to the first solder resist 312a. The first protective layer 332 may be formed of a material that is easily separated from the first solder resist 312a, such as polyethylene terephthalate (PET), or the like. The first protective layer 332 may be pre-attached to the first solder resist material 312 as illustrated in FIG. 2. Alternatively, the first protective layer 332 may be attached to the first solder resist material 312 after the first solder resist material 312 is attached to the base substrate 100 on which the conductive patterns 200 are formed.

When the first solder resist 312a is formed by attaching the first solder resist material 312 onto the base substrate 100 on which the conductive patterns 200 are formed, the first solder resist material 312 may be heated or pressurized. If the first protective layer 332 is sensitive to heat or pressure, the first protective layer 332 may be attached to the first solder resist material 312 after heating or pressurizing the first solder resist material 312.

Figure 4:
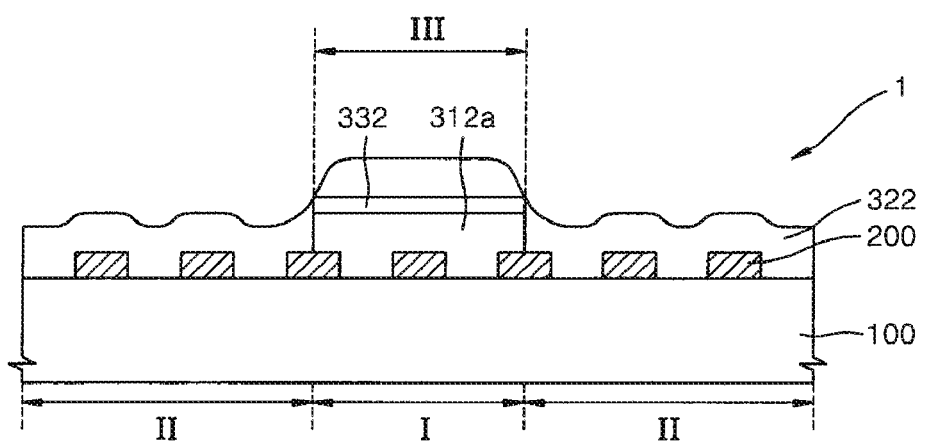
FIG. 4 illustrates an operation of forming a second solder resist material layer, according to an embodiment of the present invention.

FIG. 4 illustrates an operation of forming a second solder resist material layer 322.

Referring to FIG. 4, the second solder resist material layer 322 is formed on the base substrate 100 on which the first solder resist 312a and the first protective layer 332 are formed. The second solder resist material layer 322 may be formed by spraying an ink-type solder resist. After the ink-type solder resist is applied, the ink-type solder resist may be heated or pressurized. Thus, the second solder resist material layer 322 formed on an exterior region II may have a relatively high surface roughness due to the unevenness of the conductive patterns 200 formed below the second solder resist material layer 322. When the second solder resist material layer 322 is formed of an ink-type solder resist, the second solder resist material layer 322 may have a surface roughness in a range of several to several tens of µm due to the unevenness of the conductive patterns 200. Preferably, the surface roughness of the second solder resist material layer 322 may be in a range of about 3 to about 10 µm.

Figure 5:
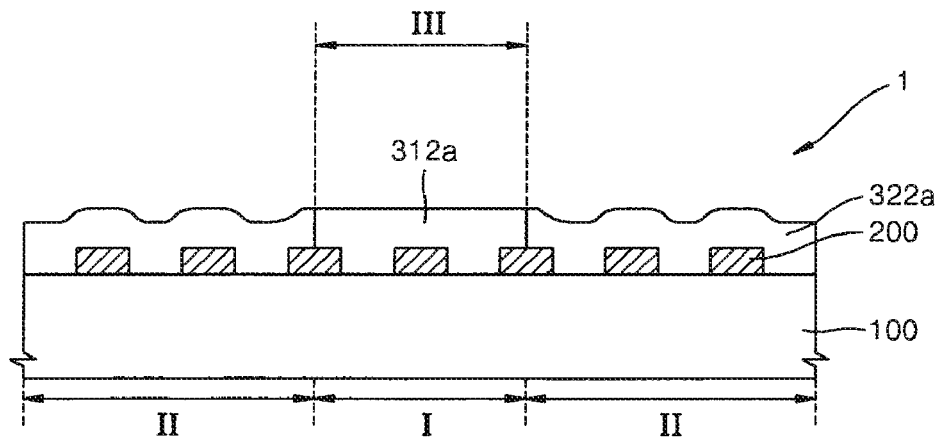
FIG. 5 illustrates an operation of removing a first protective layer, according to an embodiment of the present invention.

FIG. 5 illustrates an operation of removing the first protective layer 332.

Referring to FIG. 5, the first protective layer 332 is removed from the first solder resist 312a, thereby exposing the first solder resist 312a. At this time, a portion of the second solder resist material layer 322, which is formed on the first protective layer 332, may also be removed. Thus, the first solder resist 312a having a relatively low surface roughness may be formed on the interior region I, and a second solder resist 322a having a relatively high surface roughness may be formed on the exterior region II. The first solder resist 312a and the second solder resist 322a may then be heated or pressurized by using a roller or the like so as to be closely adhered to each other. Subsequently, the PCB 1 is completed by removing a portion of the second solder resist 322a, which is formed above a bond finger portion (210 of FIG. 1) of the conductive patterns 200. On the completed PCB 1 the surface roughness of the second solder resist 322a is greater then the surface roughness of the first solder resist 312a, as illustrated in FIG. 1.

Although not illustrated, the second solder resist material layer 322 may be formed only on the exterior region II in other embodiments. In this case, the second solder resist material layer 322 may be formed on the exterior region II except for an upper surface of the bond finger portion (210 of FIG. 1). For example, the second solder resist material layer 322 may be formed of an ink-type solder resist, and may be formed by spraying ink-type solder resist on the base substrate 100 except for the interior region I and the upper surface of the bond finger portion (210 of FIG. 1).

Figure 6:
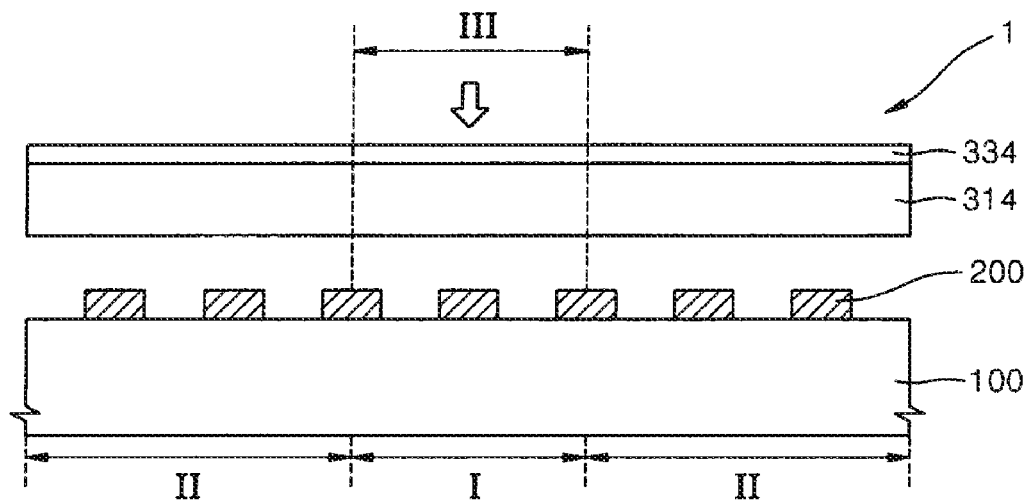
FIG. 6 illustrates an operation of attaching a first solder resist material onto a base substrate on which conductive patterns are formed, according to an embodiment of the present invention.
Figure 7:
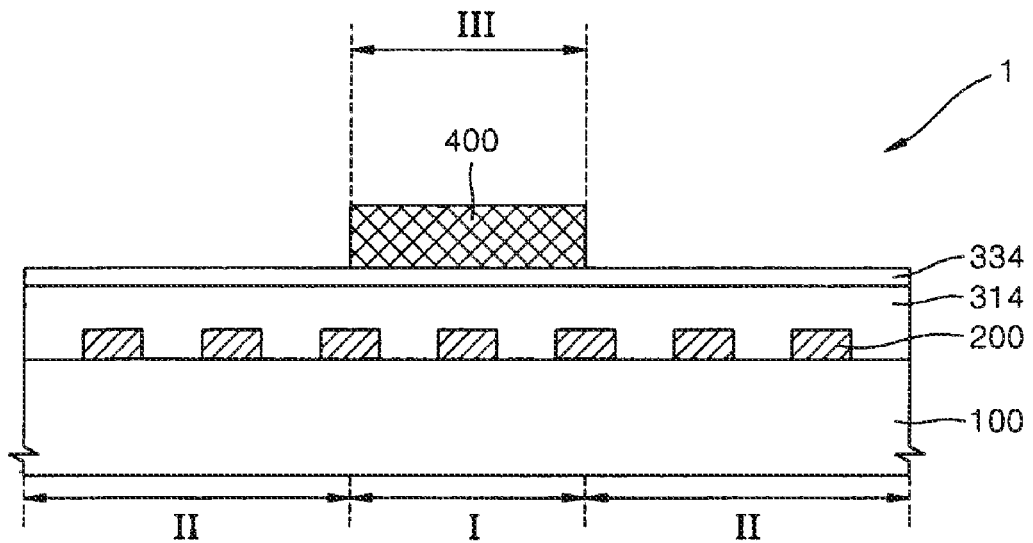
FIG. 7 illustrates an operation of forming a mask layer on a first solder resist material, according to an embodiment of the present invention.
Figure 8:
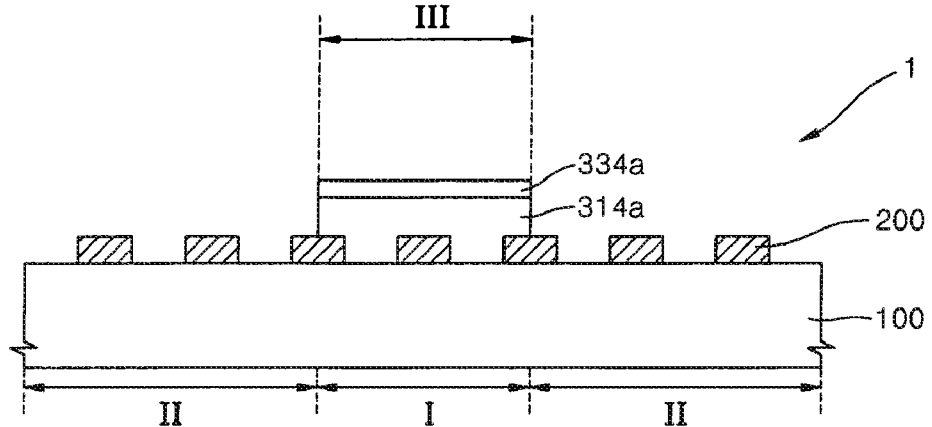
FIG. 8 illustrates an operation of forming a first solder resist, according to an embodiment of the present invention.

FIGS. 6 through 8 are cross-sectional views for illustrating a method of manufacturing a PCB 1 according to another embodiment of the present invention.

FIG. 6 illustrates an operation of attaching a first solder resist material 314 onto a base substrate 100 on which conductive patterns 200 are formed.

Referring to FIG. 6, the first solder resist material 314 is previously formed so that the area of the first solder resist material 314 corresponds to the area of a front surface of the PCB 1. The first solder resist material 314 may be formed of a film-type solder resist, and attached to the base substrate 100 on which the conductive patterns 200 are formed. The first solder resist material 314 may be previously formed to be a thin film type, and may be transformed to reduce the step difference of the conductive patterns 200 formed below the first solder resist material 314. The surface roughness of a first solder resist material 314 can attenuate the influence of unevenness due to the conductive patterns 200. For example, when a film-type solder resist is used as the first solder resist material 314, the first solder resist material 314 may have surface roughness of several µm or less due to the unevenness of the conductive patterns 200. Preferably, the surface roughness of the first solder resist material 314 may be in a range of about 0.1 to about 3 µm.

A first protective layer 334 is attached to the first solder resist material 314. The first protective layer 334 may be formed of a material that is easily separated from the first solder resist material 314. The first protective layer 334 may be pre-attached to the first solder resist material 314 as illustrated in FIG. 6. Alternatively, the first protective layer 334 may be attached to the first solder resist material 314 after the first solder resist material 314 may be attached to the base substrate 100 on which the conductive patterns 200 are formed.

The first solder resist material 314 may be heated or pressurized while it is attached to the base substrate 100 on which the conductive patterns 200 are formed. If the first protective layer 334 is sensitive to heat or pressure, the first protective layer 334 may be attached to the first solder resist material 314 after heating or pressurizing the first solder resist material 314.

FIG. 7 illustrates an operation of forming a mask layer 400 on the first solder resist material 314.

Referring to FIG. 7, the mask layer 400 is formed on the interior region I on which the first solder resist material 314 is formed. The mask layer 400 may be formed of a photoresist, or alternatively, may be formed by attaching a material having etch selectivity with respect to the first solder resist material 314 to the interior region I.

FIG. 8 illustrates an operation of forming the first solder resist 314a.

Referring to FIG. 8, using the mask layer 400 as an etch mask, a portion of the first solder resist material 314 is removed so as to form the first solder resist 314a. A portion of the first protective layer 334 is also removed using the mask layer 400 as the etch mask, to form a first protective pattern 334a on the interior region I.

Then, a second solder resist 322a is formed, thereby completing a PCB 1, as described with reference to FIGS. 4 and 5.

FIGS. 9 through 13 are cross-sectional views for illustrating a method of manufacturing a PCB 1 according to another embodiment of the present invention.

Figure 9:
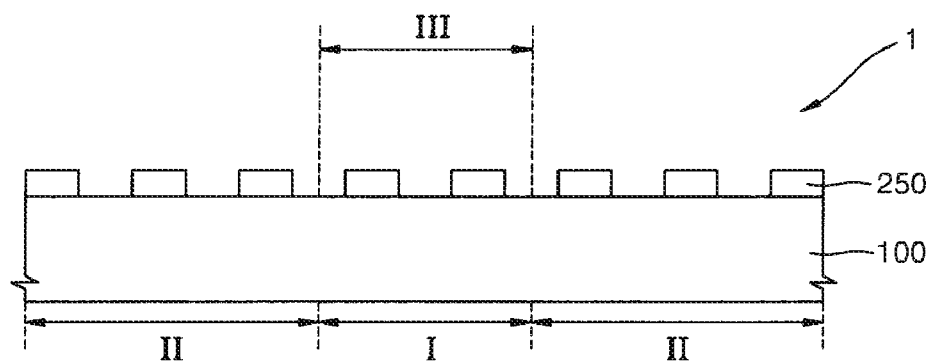
FIG. 9 illustrates an operation of forming insulating reverse patterns on a base substrate.

FIG. 9 illustrates an operation of forming insulating reverse patterns 250 on a base substrate 100.

Referring to FIG. 9, the insulating reverse patterns 250 for forming conductive patterns 202 are formed on the base substrate 100. The insulating reverse patterns 250 are formed in spaces between the conductive patterns 202.

Figure 10:
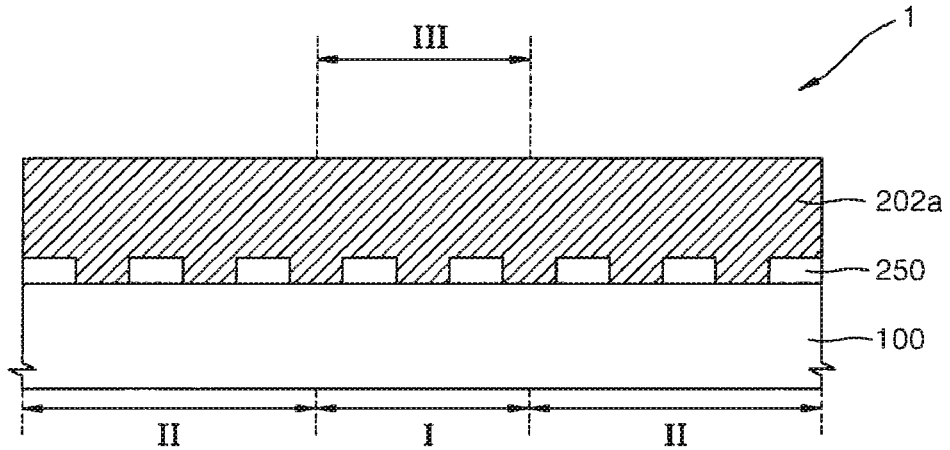
FIGS. 10 and 11 illustrate an operation of forming conductive patterns.
Figure 11:
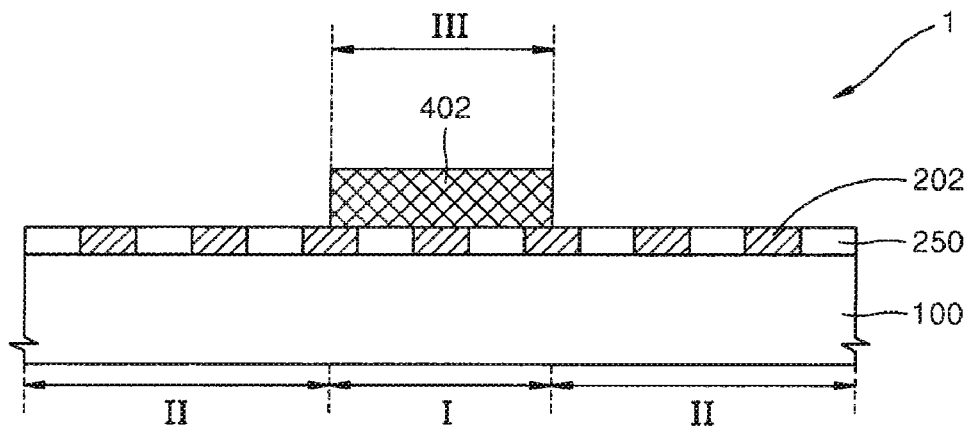

FIGS. 10 and 11 illustrate an operation of forming the conductive patterns 202.

Referring to FIGS. 10 and 11, a conductive material 202a is formed so as to fill spaces between the insulating reverse patterns 250. At this time, the conductive material 202a may cover the upper surfaces of the insulating reverse patterns 250. Then a portion of the conductive material 202a may be removed so as to expose the upper surfaces of the insulating reverse patterns 250, thereby forming the conductive patterns 202. That is, the conductive patterns 202 may be formed by planarizing the conductive material 202a until the upper surfaces of the insulating reverse patterns 250 are exposed. At this time, an upper surface of a bond finger portion (not shown) of the conductive patterns 202 may be plated with another conductive material. Then, a mask layer 402 may be formed on the interior region I of the base substrate 100 on which the conductive patterns 202 are formed.

Figure 12:
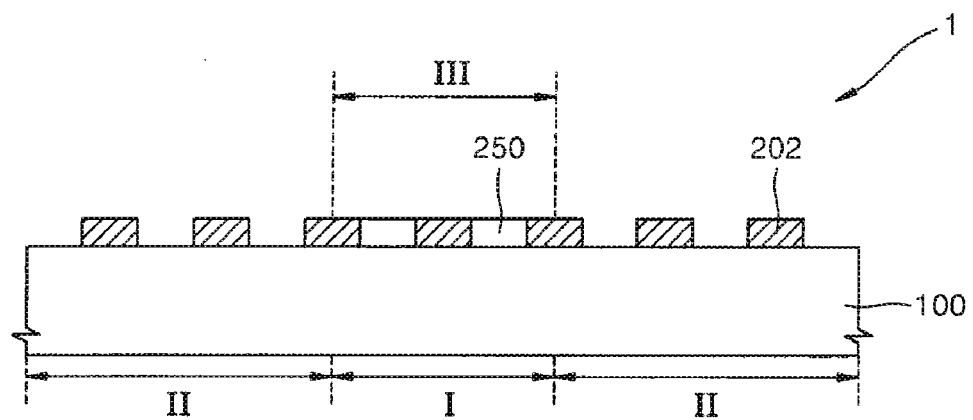
FIG. 12 illustrates an operation of removing a portion of the insulating reverse patterns, according to an embodiment of the present invention.

FIG. 12 illustrates an operation of removing a portion of the insulating reverse patterns 250.

Referring to FIG. 12, using the mask layer 402 as an etch mask, the insulating reverse patterns 250 corresponding to the exterior regions II are removed, while the insulating reverse patterns 250 on the interior region I remain. The mask layer 402 may then be removed so as to expose the insulating reverse patterns 250 on the interior region I.

Figure 13:
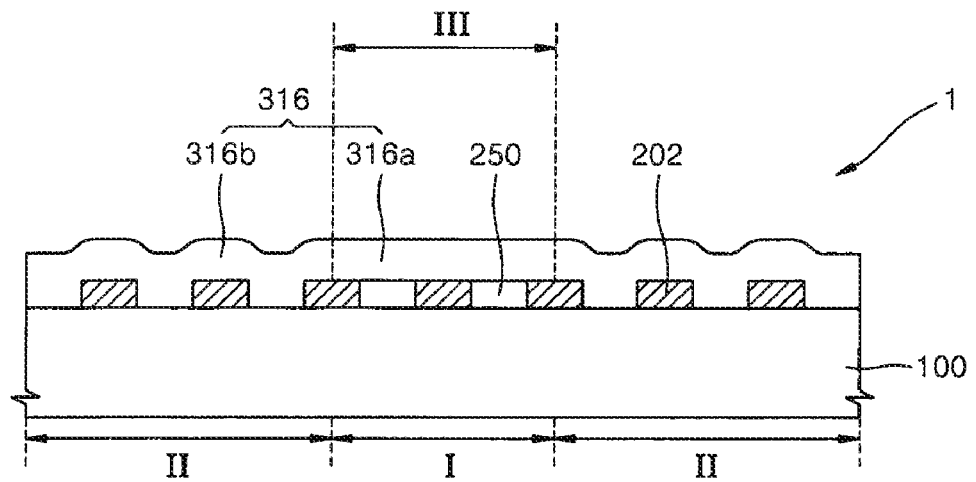
FIG. 13 illustrates an operation of forming a solder resist, according to an embodiment of the present invention.

FIG. 13 illustrates an operation of forming a solder resist 316.

Referring to FIG. 13, the solder resist 316 is formed on the base substrate 100 on which the conductive patterns 202 and the insulating reverse patterns 250 are formed. Since spaces between the conductive patterns 202 on the interior region I are filled with the insulating reverse patterns 250, a first solder resist 316a on the interior region I may be formed to be a substantially flat plane. Since spaces between the conductive patterns 202 on the exterior region II are not filled, the surface of the second solder resist 316b on the exterior region II may be uneven, and thus the second solder resist 316b may have a greater surface roughness than the surface roughness of the first solder resist 316a on the interior region I.

In addition, the solder resist 316 may not be formed on the bond finger portion. Alternatively, a portion of the solder resist 316 may be removed after forming the solder resist 316 thereby exposing the bond finger portion (210 of FIG. 1).

Figure 14:
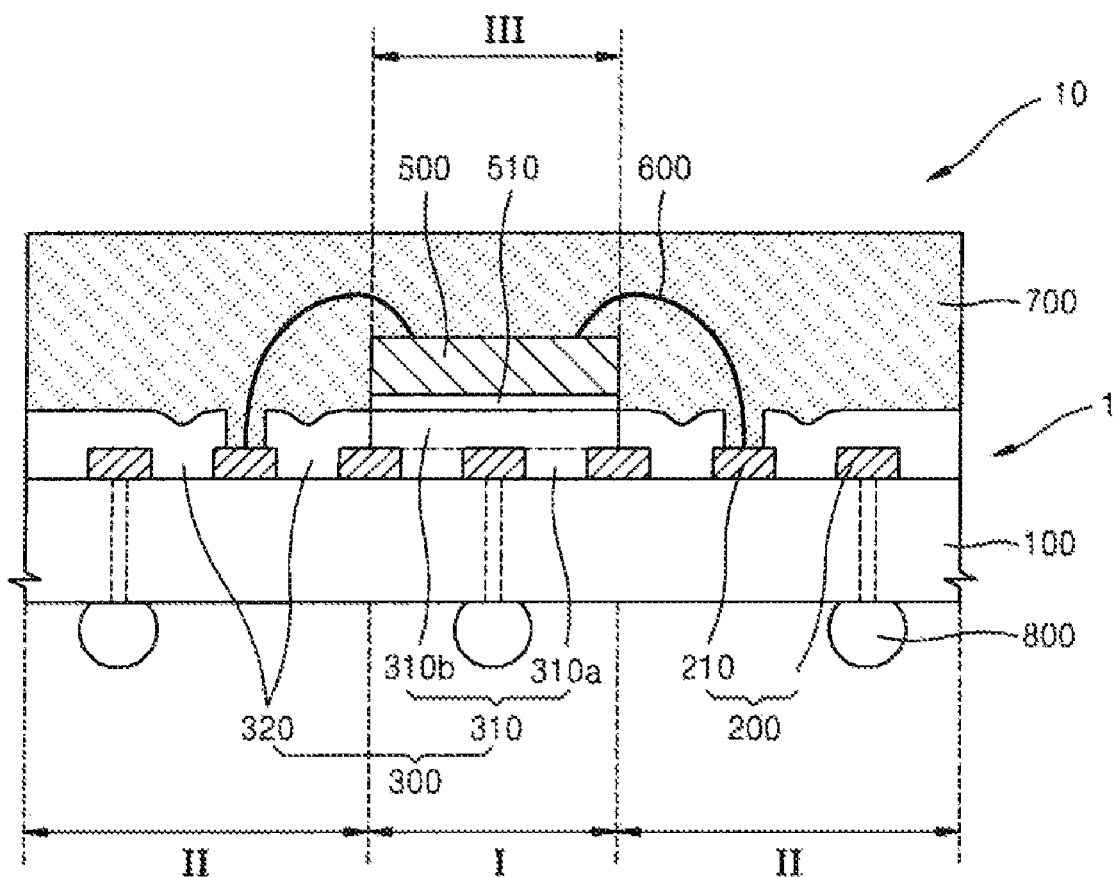
FIG. 14 illustrates a semiconductor package according to an embodiment of the present invention.

FIG. 14 is a semiconductor package 10 according to an embodiment of the present invention.

Referring to FIG. 14, a PCB 1 includes a base substrate 100, conductive patterns 200 and a solder resist 300, which are sequentially formed. The base substrate 100 is formed of an insulating material that may be a rigid material, such as a BT resin, FR4, or the like. Alternatively, the base substrate 100 may be formed of a flexible material, such as PI, PET, or the like.

The conductive patterns 200 may be formed of a metal material such as Cu. Alternatively, conductive patterns 200 may be formed by using a method of first forming a metal material pattern, such as Cu, and then plating a portion of the pattern with a different metal material (e.g., Ni or Au). A portion of the conductive patterns 200 are used for a bond finger portion 210 that is in contact with a bonding wire 600 and a sealant 700. The bond finger portion 210 may be formed by using a method of first forming a metal material pattern, such as Cu, and then plating a portion of the pattern with a different metal material (e.g., Ni or Au). The conductive patterns 200 may be formed so that an upper surface of the conductive patterns is non-coplanar with an upper surface of the base substrate in the interior region. That is, the conductive patterns may have unevenness in the interior region for receiving a semiconductor chip 500. The conductive patterns 200 are illustrated as line-and-space patterns, but the present invention is not limited thereto, and may include other patterns where the conductive patterns 200 are uneven.

The solder resist 300 includes a first solder resist 310 formed on an interior region I and a second solder resist 320 formed on an exterior region II. The interior region I may include a die paddle III to which the semiconductor chip 500 is attached. The interior region I may be formed to have substantially the same area as that of the die paddle III. However, if varying sizes of semiconductor chips are used or processing margin are considered, the interior region I may be wider than the die paddle III.

The first solder resist 310 may be formed to be a substantially flat plane having no surface roughness. The second solder resist 320 may have a greater surface roughness than the surface roughness of the first solder resist 310. The second solder resist 320 may have a surface roughness in a range of several to several tens of μm.

The first solder resist 310 may be formed of a film-type solder resist. The first solder resist 310 may be formed by attaching a film-type solder resist that is previously formed to the interior region I. Alternatively, the first solder resist 310 may be formed using a method of attaching a film-type solder resist onto a front surface of the base substrate 100 and then removing the film-type solder resist except for the portions that are attached to the interior region I. After the film-type solder resist is attached to the interior region I, the film-type solder resist may be heated or pressurized. When the first solder resist 310 is formed of a film-type solder resist, the first solder resist 310 may have surface roughness of several μm or less due to the surface roughness of the conductive patterns 200. Preferably, the surface roughness of the first solder resist 310 may be in a range of about 0.1 to about 3 μm.

The second solder resist 320 may be formed by spraying an ink-type solder resist onto the exterior region II. After the ink-type solder resist is applied, the ink-type solder resist may be heated or pressurized. When the second solder resist 320 is formed of an ink-type solder resist, the second solder resist 320 may have a surface roughness in a range of several to several tens of μm due to the unevenness of the conductive patterns 200. Preferably, the surface roughness of the second solder resist 320 may be in a range of about 3 to about 10 μm. Unlike the case of a film-type solder resist, an ink-type solder resist may be greatly affected by unevenness of a layer disposed below the ink-type solder resist. Thus, the second solder resist 320 may have a greater surface roughness than the surface roughness of the first solder resist 310.

The first solder resist 310 may include a solder insulating layer 310a and a third solder resist 310b. The solder insulating layer 310a may have the same height as that of the conductive patterns 200. The third solder resist 310b may be formed on the conductive patterns 200. The solder insulating layer 310a may be formed to fill the spaces between the conductive patterns 200 disposed on the interior region I. The second solder resist 320 and the third solder resist 310b may be substantially simultaneously formed. In this case, the second solder resist 320 and the third solder resist 310b may be formed of, for example, an ink-type solder resist. Thus, the first solder resist 310 may be formed to be a substantially flat plane, and the second solder resist 320 may have a surface roughness in a range of several to several tens of μm. Preferably, the surface roughness of the second solder resist 320 may be in a range of about 3 to about 10 μm.

Although not illustrated in FIG. 14, a conductive pattern and a solder resist may also be formed on a bottom surface of the base substrate 100. If the semiconductor chip 500 is attached to the bottom surface of the base substrate 100, the solder resist layer may be formed so as to be divided into a first solder resist and a second solder resist as it was in the case where the first solder resist 310 and the second solder resist 320 are formed on the base substrate 100. On the other hand, if the semiconductor chip 500 is not attached to the bottom surface of the base substrate 100, the solder resist layer formed on the bottom surface of the base substrate 100 may be formed as a single layer.

The semiconductor chip 500 may be attached to the first solder resist 310 of the die paddle III by using an adhesive tape 510. In this case, the thickness of the semiconductor package 10 may be reduced in comparison to conventional semiconductor packages where conventional epoxy-based adhesives are used. Since the first solder resist 310 is formed to be a substantially flat plane or a plane having a relatively small surface roughness, voids are not formed between the adhesive tape 510 and the first solder resist 310, thereby preventing a swelling failure or delamination. Delamination or swelling failure generally occurs when voids are exposed to high temperatures or high humidity during sealant 700 formation or reliability testing.

The semiconductor chip 500 and the bonding finger portion 210 of the conductive patterns 200 are electrically connected to each other by a bonding wire 600. The bonding wire 600 may be formed of a conductive material such as Au.

First solder balls 800 may be formed on a bottom surface of the semiconductor package 10, wherein the first solder balls 800 are connected to the conductive patterns 200. The first solder balls 800 may be used for electrically connecting the semiconductor package 10 to an external apparatus (not shown).

After attaching the semiconductor chip 500 and forming the bonding wire 600, the sealant 700 is disposed over the base substrate to seal the semiconductor chip 500 and the bonding wire 600. The sealant 700 may be formed of an epoxy molding compound (EMC). The sealant 700 may be in contact with the second solder resist 320 and seals the semiconductor package 10. Since the surface roughness of the second solder resist 320 is increased due to a step difference of the conductive patterns 200, delamination of the sealant 700 can be prevented.

When the interior region I has substantially the same area of that of the die paddle III, the sealant 700 may not be in contact with the first solder resist 310. However, although not illustrated, when the interior region I has a wide area including the die paddle III, the sealant 700 may be in contact with a portion of the first solder resist 310 having a relatively small surface roughness. In this case, delamination may occur at a contact portion between the sealant 700 and the first solder resist 310. The delamination may still be prevented on the exterior region II between the sealant 700 and the second solder resist 320. That is, air, humidity or the like that may cause delamination can permeate into the contact portion between the sealant 700 and the second solder resist 320, thereby preventing delamination.

Figure 15:
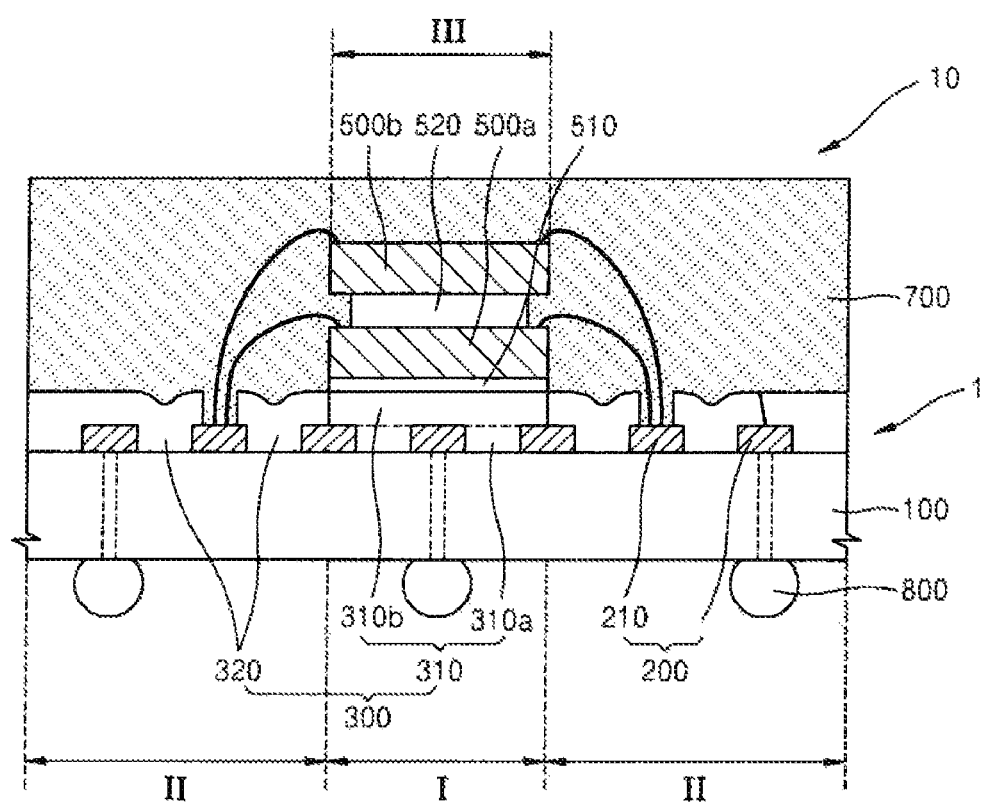
Figure 16:
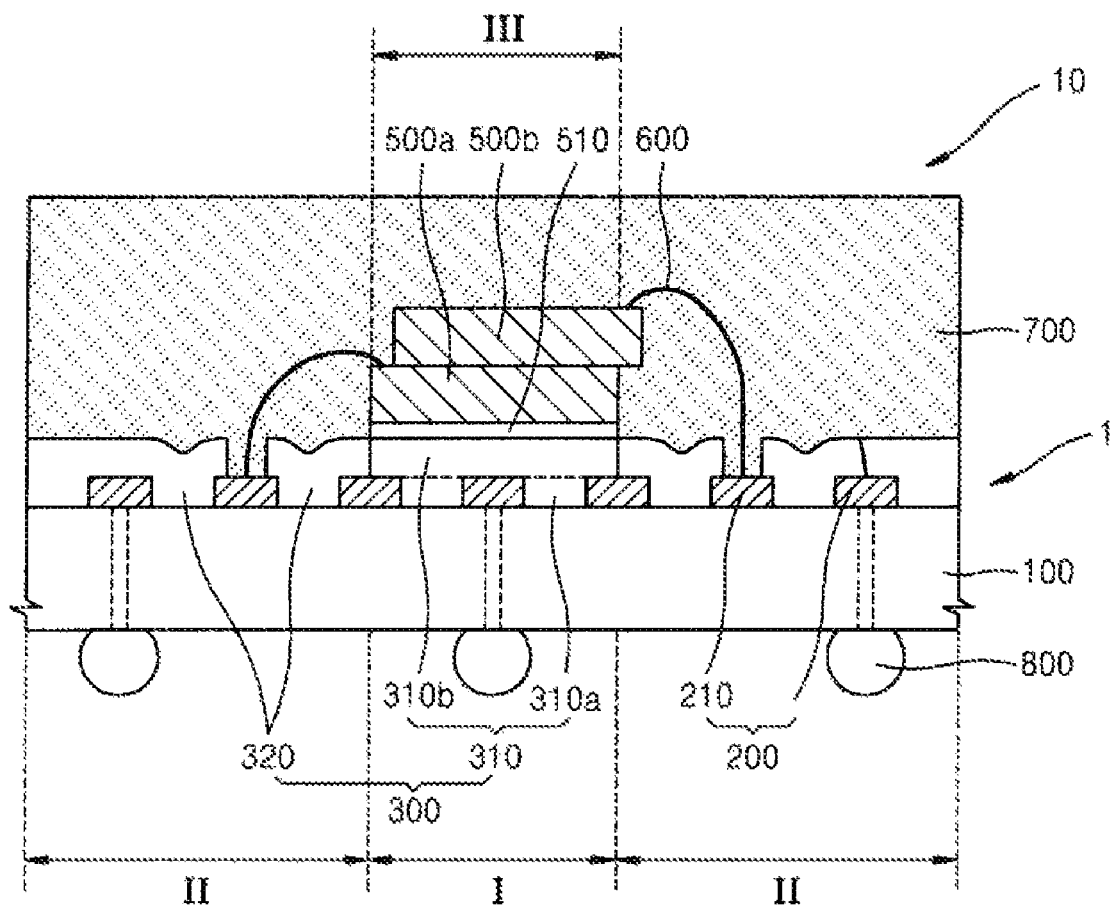

FIGS. 15 through 17 are cross-sectional views of a semiconductor package 10 according to embodiments of the present invention. Hereinafter, the description of the same parts in the drawings will not be described.

Referring to FIG. 15, a second semiconductor chip 500*b* is stacked on a first semiconductor chip 500*a* attached to a PCB 1. An interposer 520 may be disposed between the second semiconductor chip 500*b* and the first semiconductor chip 500*a* using an adhesive tape (not shown). The second semiconductor chip 500*b* and the first semiconductor chip 500*a* may be similar in kind, function or size, or alternatively, may be different in kind, function or size. The second semiconductor chip 500*b* may be electrically connected to the conductive patterns 200 by a bonding wire 600 in a similar manner as the first semiconductor chip 500*a*. Likewise, in the case of a multi-chip package (MCP) including a plurality of stacked semiconductor chips, the adhesive tape 510 may reduce the thickness of the semiconductor package 10. Thus, due to the second solder resist 320 having a greater surface roughness than the surface roughness of the first solder resist 310, voids and delamination can be prevented.

Referring to FIG. 16, a second semiconductor chip 500*b* is stacked on a first semiconductor chip 500*a* attached onto a PCB 1 by using an adhesive tape 510 so as to be horizontally out of line. The second semiconductor chip 500*b* and the first semiconductor chip 500*a* may be similar in kind, function or size, or alternatively, may be different in kind, function or size. The second semiconductor chip 500*b* may be electrically connected to the conductive patterns 200 by a bonding wire 600 in a similar manner as the first semiconductor chip 500*a*.

Referring to FIG. 17, a second semiconductor chip 500*b* of a flip chip may be stacked on a first semiconductor chip 500*a* attached to a PCB 1 by using an adhesive tape 510. The second semiconductor chip 500*b* may be electrically connected to the first semiconductor chip 500*a* by a second solder ball 550. This structure may be used in the case of a plurality of stacked semiconductor chips being of different kinds, functions or sizes.

The present invention is not limited to the MCP structure illustrated in FIGS. 15 through 17. Rather, additional semiconductor chips may be stacked on the first and second semiconductor chips. The semiconductor chips may again be similar in kind, function, or size, or alternatively, may be different in kind, function or size. Additionally, some of the semiconductor chips may be similar in kind, function, or size, while other ones of the semiconductor chips may be different in kind, function or size.

According to the above embodiments: voids that may form between the adhesive tape and the solder resist during sealant formation and reliability testing, can be prevented in a PCB, thereby preventing swelling failure. Additionally, delamination that may occur between a sealant used for sealing a semiconductor package and a solder resist can be prevented in a PCB, thereby preventing failure of the semiconductor package.

Accordingly, a semiconductor package can be manufactured so as to have high reliability while being ultra slim.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A printed circuit board (PCB) comprising:
   a base substrate on which conductive patterns including a bond finger portion are formed and which includes an interior region having a die paddle for receiving a semiconductor chip and an exterior region disposed outside the interior region;
   a first solder resist formed on a portion of the base substrate corresponding to the interior region; and
   a second solder resist formed on a portion of the base substrate corresponding to the exterior region, wherein the second solder resist has a surface roughness greater than a surface roughness of the first solder resist.

2. The PCB of claim 1, wherein upper surfaces of the conductive patterns are non-coplanar with an upper surface of the base substrate in the interior region.

3. The PCB of claim 2, wherein the first solder resist comprises:
an insulating material layer filling spaces between the conductive patterns; and
a third solder resist formed on the conductive patterns and the insulating material layer.

4. The PCB of claim 3, wherein the second solder resist and the third solder resist are each an ink-type solder resist.

5. The PCB of claim 1, wherein the first solder resist is a film-type solder resist.

6. The PCB of claim 1, wherein the second solder resist is an ink-type solder resist.

7. The PCB of claim 1, wherein the second solder resist is formed so as to expose a bond finger portion of the conductive patterns.

8. A semiconductor package comprising:
a PCB including:
a base substrate on which conductive patterns including a bond finger portion are formed and which includes an interior region having a die paddle for receiving a semiconductor chip and an exterior region disposed outside the interior region;
a first solder resist formed on a portion of the base substrate corresponding to the interior region; and
a second solder resist formed on a portion of the base substrate corresponding to the exterior region, wherein the second solder resist has a surface roughness greater than a surface roughness of the first solder resist;
a semiconductor chip attached to the die paddle with an adhesive tape; and
a bonding wire to electrically connect the semiconductor chip to the conductive patterns.

9. The semiconductor package of claim 8, wherein upper surfaces of the conductive patterns are non-coplanar with an upper surface of the base substrate in the interior region.

10. The semiconductor package of claim 9, wherein the first solder resist comprises:
an insulating material layer filling spaces between the conductive patterns; and
a third solder resist formed on the conductive patterns and the insulating material layer.

11. The semiconductor package of claim 10, wherein the second solder resist and the third solder resist are each an ink-type solder resist.

12. The semiconductor package of claim 8, wherein the first solder resist is a film-tune solder resist.

13. The semiconductor package of claim 8, wherein the second solder resist is an ink-type solder resist.

14. The semiconductor package of claim 8, further comprising a sealant to seal the semiconductor chip and the bonding wire on the PCB.

15. The semiconductor package of claim 8, further comprising at least one other semiconductor chip stacked on the semiconductor chip.

16. The semiconductor package of claim 15, wherein the at least one other semiconductor chip and the semiconductor chip attached to the die paddle have different functions.

17. The semiconductor package of claim 15, wherein the at least one other semiconductor chip is electrically connected to the semiconductor chip or the conductive patterns via a bonding wire.

18. The semiconductor package of claim 15, wherein the at least one other semiconductor chip is a flip chip that is electrically connected to the semiconductor chip.

19. The semiconductor package of claim 8, further comprising a solder ball that is disposed on a bottom surface of the PCB and is electrically connected to the conductive patterns.

20. The semiconductor package of claim 8, wherein the second solder resist is formed so as to expose a bond finger portion of the conductive patterns.

* * * * *